US011361772B2

(12) United States Patent
Daly et al.

(10) Patent No.: US 11,361,772 B2
(45) Date of Patent: Jun. 14, 2022

(54) ADAPTIVE AND FIXED MAPPING FOR COMPRESSION AND DECOMPRESSION OF AUDIO DATA

(71) Applicant: Microsoft Technology Licensing, LLC, Redmond, WA (US)

(72) Inventors: Gregory M. Daly, Seattle, WA (US); Garrett Douglas Blankenburg, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 24 days.

(21) Appl. No.: 16/412,365

(22) Filed: May 14, 2019

(65) Prior Publication Data
US 2020/0365162 A1  Nov. 19, 2020

(51) Int. Cl.
*G10L 19/002* (2013.01)
*H03M 7/30* (2006.01)
(Continued)

(52) U.S. Cl.
CPC ......... *G10L 19/002* (2013.01); *H03M 7/3066* (2013.01); *H03M 7/60* (2013.01)

(58) Field of Classification Search
CPC ........ H03M 7/30; H03M 7/3066; H03M 7/60; H03M 7/6005; H03M 7/6011; H03M 7/6041; H03M 7/6058; H03M 1/0854; H03M 1/18; H03M 1/181; H03M 1/182; H03M 1/183; H03M 1/185; H03M 1/186;
(Continued)

(56) References Cited

U.S. PATENT DOCUMENTS 4,464,783 A * 8/1984 Beraud .................. H04B 1/667
  341/51
5,255,370 A * 10/1993 Sako ....................... G06F 13/38
  710/316
(Continued)

FOREIGN PATENT DOCUMENTS

CN          101872618 A       10/2010

OTHER PUBLICATIONS

Linley, Anthony, "ADPCM With A PIC32", In Design Project Report of Cornell University in Partial Fulfillment of the Requirements for the Degree of Master of Engineering, Electrical and Computer Engineering, Aug. 2017, pp. 1-18.
(Continued)

*Primary Examiner* — Leshui Zhang
(74) *Attorney, Agent, or Firm* — Klarquist Sparkman, LLP

(57) ABSTRACT

Systems, methods, and software are disclosed herein for compressing audio data. In an implementation, sampled values of an audio signal have a dynamic range. A division of the dynamic range, into at least a lower range and an upper range, is identified based on a fixed mapping of a lower portion of the sampled values to a subset of quanta in a set of quanta having a depth less than a depth of the sampled values. Then an adaptive mapping of an upper portion of the sampled values to a remaining subset of quanta in the set of quanta is also identified, based at least on a dimension of the upper range. The fixed mapping is used to encode the lower portion of the sampled values based, while the adaptive mapping is used to encode the upper portion of the sampled values based on the adaptive mapping.

20 Claims, 11 Drawing Sheets

(51) Int. Cl.
*G10L 19/02* (2013.01)
*G10L 19/00* (2013.01)

(58) Field of Classification Search
CPC ...... H03M 1/187; H03M 1/188; H03M 3/478; H03M 3/48; H03M 3/482; H03M 1/001; H03M 1/02; H03M 5/00; H03M 5/02; H03M 5/04; H03M 5/06; H03M 5/08; H03M 5/12; H03M 5/16; H03M 5/20; H03M 5/145; H03M 7/00; H03M 7/08; H03M 7/12; H03M 7/3002; H03M 7/3004; H03M 7/40; H03M 7/42; H03M 7/4025; H03M 7/46; H03M 7/50; H03M 9/00; G10L 19/002; G10L 19/032; G10L 19/035; G10L 19/038; G10L 19/00; G10L 19/02; G06F 5/00; H04L 25/4917; H04L 25/4908; H04S 3/02
USPC ........ 704/201, 221, 222, 229, 230, E19.015, 704/E19.016, E19.017; 341/126, 128, 341/129, 130, 138, 139, 140, 155, 156, 341/167, 168, 169, 170; 381/22, 23
See application file for complete search history.

(56) References Cited

U.S. PATENT DOCUMENTS

| | | | | |
|---|---|---|---|---|
| 5,371,501 | A | * | 12/1994 | Garverick ............... H03M 1/58 341/139 |
| 5,402,124 | A | * | 3/1995 | Todd ................... H03M 1/0854 341/131 |
| 6,246,345 | B1 | | 6/2001 | Davidson et al. |
| 6,922,730 | B1 | | 7/2005 | Yaple |
| 7,395,209 | B1 | | 7/2008 | Mesarovic et al. |
| 8,804,971 | B1 | * | 8/2014 | Williams .............. G10L 19/008 381/23 |
| 9,236,058 | B2 | | 1/2016 | Subasingha et al. |
| 9,781,447 | B1 | | 10/2017 | Bultje |
| 9,947,327 | B2 | | 4/2018 | Srinivasan et al. |
| 10,062,248 | B2 | | 8/2018 | Ullrich et al. |
| 2013/0044819 | A1 | | 2/2013 | Uppalapati et al. |

OTHER PUBLICATIONS

"International Search Report and Written Opinion Issued in PCT Application No. PCT/US20/027123", dated Jul. 3, 2020, 11 Pages.
Communication pursuant to Rules 161(1) and 162 EPC dated Dec. 21, 2021, from European Patent Application No. 20723644.9, 3 pp.

* cited by examiner

ADAPTIVE AND FIXED MAPPING FOR COMPRESSION AND DECOMPRESSION OF AUDIO DATA

TECHNICAL FIELD

Aspects of the disclosure are related to audio signals and more particularly to compressing and decompressing audio data.

TECHNICAL BACKGROUND

Many devices use a specific set of tones, sounds, or music to communicate states of operation to a user. For example, many gaming systems emit different sounds to indicate that a device is powering-on, powering-off, ejecting a disk, or has no disc at all. Compression algorithms are employed to make storing the associated audio data more efficient, but the required decompression is usually expensive from both a cost and resource perspective. Using uncompressed audio data overcomes these limitations but is storage-inefficient.

A compromise is to reduce the fidelity of an audio signal. Tones are first sampled in a 24-bit format and then converted to a 16-bit format. Approximately 65,000 different values can be represented by 16 bits (binary), but at the cost of storage. By reducing the depth of a tone to 8 bits, the cost of storage is nearly halved, but much of the fidelity of the signal is lost because only 128 different values can be represented by 8 bits. The data may be expanded back to 16 bits, but once the fidelity has been lost, it cannot be recovered.

Nevertheless, such compression and expansion of audio data has been employed in various applications to make them more storage or bandwidth efficient, even at the cost of fidelity. For example, many telephony systems reduce the fidelity of the signals that carry voice communications in order to conserve bandwidth. This has the effect of making the sound of phone calls less faithful than the sound of an in-person conversation.

Most of the dynamic range of an audio signal is concentrated within a minority of the samples of its sinusoidal waveform. This means that the loss of fidelity that occurs when an audio signal is compressed is concentrated on the lower (or softer) portions of the dynamic range. Expanding the data to a greater depth may help to put the data in a format suitable for further processing, but it does not return to its original fidelity. The result is an audible signal of poor quality that lacks too much of its original dynamic range—especially lower in the range.

Overview

Technology is disclosed herein that enhances the compression and decompression of audio data, allowing greater fidelity to be maintained in the lower ranges of signals than otherwise, while mitigating the performance and cost impact of decompression.

In an implementation, sampled values of an audio signal have a dynamic range. A division of the dynamic range, into at least a lower range and an upper range, is identified based on a fixed mapping of some of the sampled values to a subset of quanta in a set of quanta having a depth less than a depth of the sampled values. Then an adaptive mapping of a remaining portion of the sampled values to a remaining subset of quanta in the set of quanta is also identified, based at least on a dimension of the upper range. The fixed mapping is used to encode the lower range of the sampled values, while the adaptive mapping is used to encode the upper range of the sampled values.

In another implementation, a memory has a file stored thereon that includes first and second encoded values. The first encoded values comprise a lower portion of sampled values, in a lower range of a dynamic range of a signal, encoded by a fixed mapping of the lower portion of the sampled values to a subset of quanta in a set of quanta. The set of quanta has a depth less than a depth of the sampled values. The second encoded values comprise an upper portion of the sampled values, in an upper range of the dynamic range of the signal, encoded by an adaptive mapping of the upper portion of the sampled values to a remaining subset of quanta in the set of quanta.

The file also includes a key for mapping the set of quanta to a set of corresponding decoded values having a depth greater than the depth of the set of quanta. One or more processors operatively coupled with the memory read the file, map the first encoded values and the second encoded values to the decoded values using the key, and output the decoded values.

This Overview is provided to introduce a selection of concepts in a simplified form that are further described below in the Technical Disclosure. It may be understood that this Overview is not intended to identify key features or essential features of the claimed subject matter, nor is it intended to be used to limit the scope of the claimed subject matter.

BRIEF DESCRIPTION OF THE DRAWINGS

Many aspects of the disclosure may be better understood with reference to the following drawings. The components in the drawings are not necessarily to scale, emphasis instead being placed upon clearly illustrating the principles of the present disclosure. Moreover, like reference numerals in the drawings designate corresponding parts throughout the several views. While several embodiments are described in connection with these drawings, the disclosure is not limited to the embodiments disclosed herein. On the contrary, the intent is to cover all alternatives, modifications, and equivalents.

DETAILED DESCRIPTION

Technology is disclosed herein for compressing audio data using fixed and adaptive mapping schemes such that storage space is conserved—and fidelity is preserved—to a greater degree than with previous solutions. The fixed mapping discussed below ensures that sampled values in the lower portion of the dynamic range of a signal are retained when audio data is down-converted from one depth to another. The adaptive mapping adapts to the coverage that may be obtained by the fixed mapping from one tone or sound to another. The encoded values produced by the fixed and adaptive mapping may be written to an audio file along with a key for decoding the values.

The file, being reduced in size relative to its original counterpart, can be deployed in the context of storage-constrained environments such as microcontrollers that drive audible sounds for gaming consoles, home and entertainment appliances, and even some greeting cards. The on-board process of up-converting the encoded values to a larger depth suitable for being played-out is straight-forward mapping of values, in contrast with resource hungry decompression schemes. And as mentioned, the decoding can be carried out by an inexpensive microcontroller that can operate before the main processing unit on a device is ready. Thus, the solution(s) disclosed herein are especially applicable to devices that produce relatively brief tones or groups of tones that signify various states such as power-on, power-off, and the like.

Figure 1:
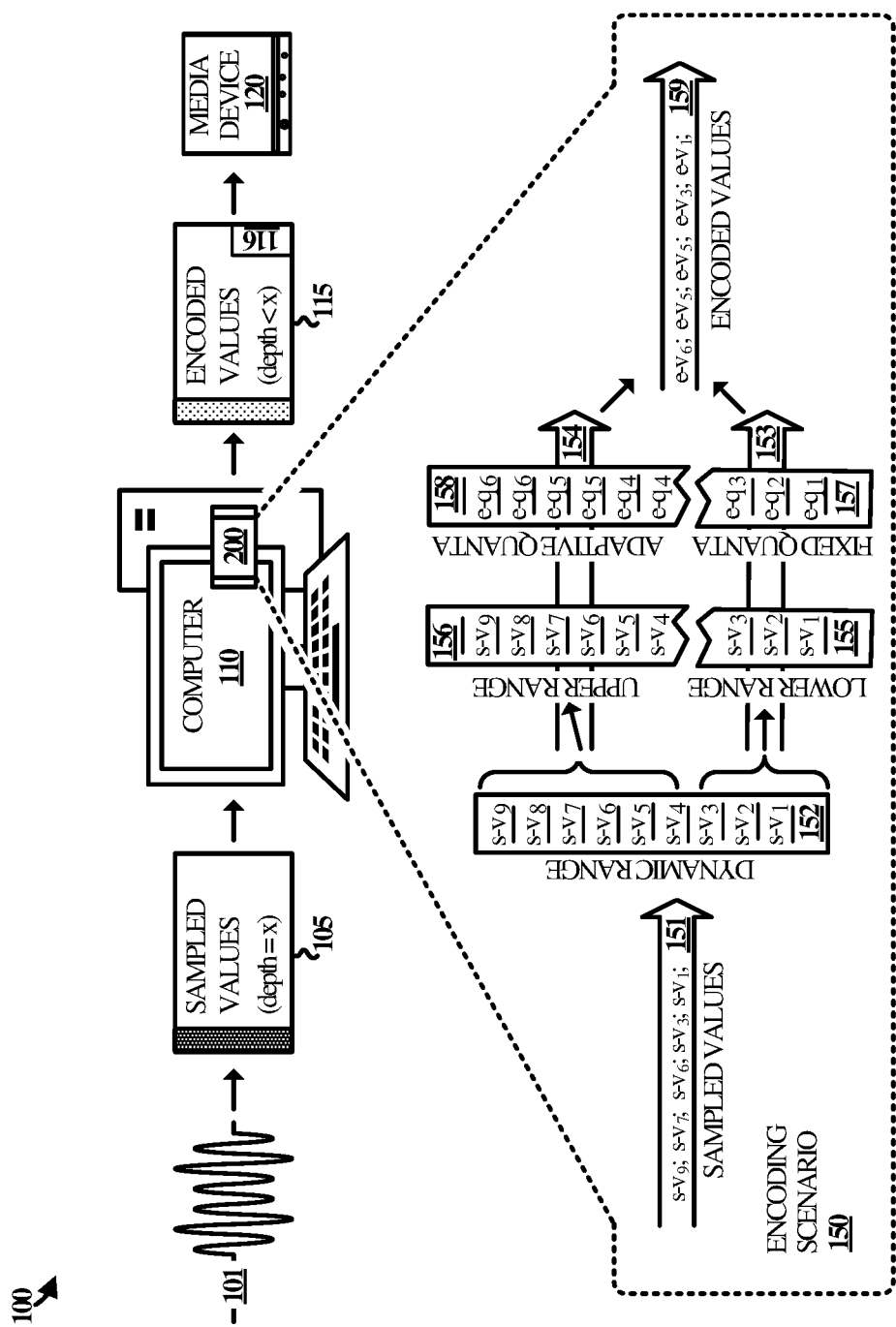
FIG. 1 illustrates an operational environment and related scenario in an implementation of audio data compression.
Figure 10:
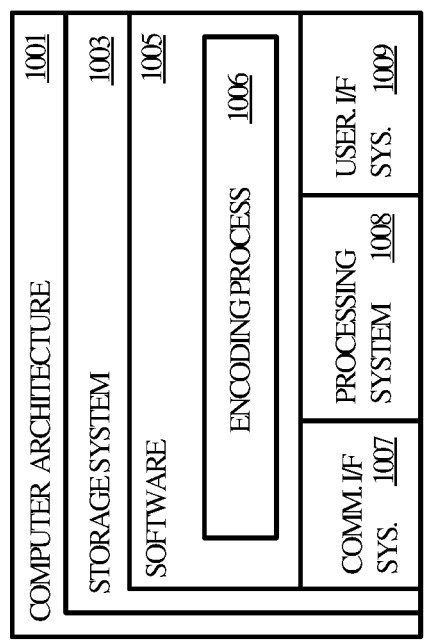
FIG. 10 illustrates a computing device suitable for implementing the various operational environments, architectures, processes, scenarios, and sequences discussed below with respect to the Figures.

Referring now to the drawings, FIG. 1 illustrates an operational environment 100 in an implementation. Operational environment 100 includes a computer 110 and media device 120. Computer 110 is representative of any computing device(s) capable of processing audio data based on a fixed and dynamic mapping and producing a file having the encoded audio data stored therein. Examples include, but are not limited to, laptop and desktop computers, server computers, and other such computing devices having an architecture suitable for compressing audio data, of which computer architecture 1001 in FIG. 10 is representative.

Media device 120 is representative of any device capable of playing out audible sound based on the encoded audio data stored in the file produced by computer 110. Examples of media device 120 include—but are not limited to—computers of all types, phones, gaming consoles, digital appliances, entertainment devices, and any other devices that employ microcontrollers to drive the output of tones, sounds, music, and the like. In fact, even a very simple devices such as a greeting card with audio features is an example of media device 120.

In operation, recording equipment (not shown) records an audio signal 101 and samples the signal to produce a file 105 having sampled values stored therein. The sampled values have a depth of "x" such as 16 bits (although the signal may be originally been sampled at a higher depth, e.g. 24 bits, and down-converted to 16 bits). File 105 is representative of any file having raw audio data stored in accordance with any of a variety of formats such as the pulse code modulation (PCM) format, the waveform audio file (WAV) format, and the audio interchange file format (AIFF). The sampled values may represent voltage, amperes, power, or any other unit of measured. In some scenarios, the sampled values may represent decibels.

Computer 110 takes file 105 as input and produces file 115 as output. File 115 is representative of any file having encoded values stored therein having a depth less than the sampled values in file 105. File 115 also includes a key 116 for decoding the encoded values on media device 120 and playing-out the audible sound represented in the audio data. Examples of key 116 include a table that maps the encoded values (or encoding quanta) to decoded values. Key 116 may be a one-dimensional list in some scenarios where the order of the decoded values implicitly identifies their corresponding quantized value without having to explicitly express the correspondence (further saving space). The decoded values may represent voltage, amperes, power, or other units of measurement. In some scenarios, the decoded values may be given in terms of decibels, in which case a conversion calculation may be performed.

Figure 2:
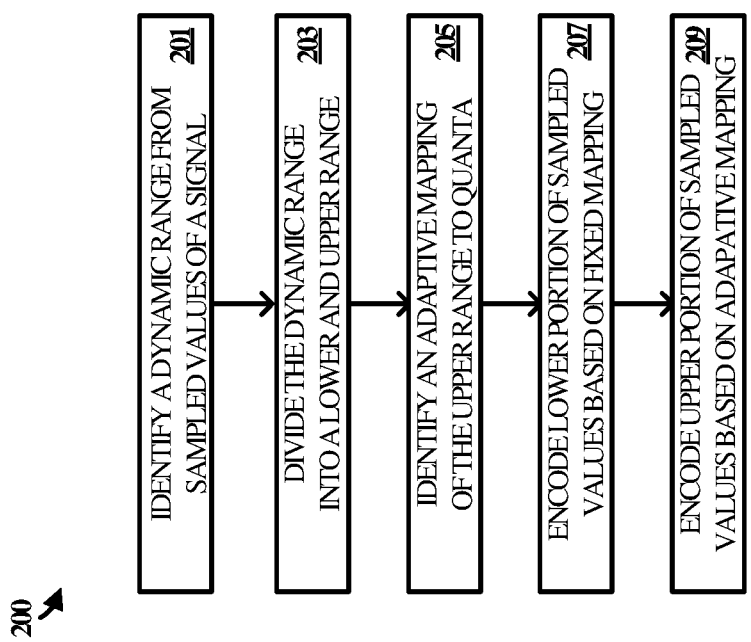
FIG. 2 illustrates an encoding process in an implementation.

FIG. 2 illustrates an encoding process 200 implemented by hardware, firmware, and/or software on computer 110 to compress audio data. Encoding process 200 may be implemented in program instructions in the context of any of the modules, components, or other such hardware, firmware, or software elements of computer 110. The program instructions direct computer 110 to operate as described for encoding process 200, referring parenthetically to the steps in FIG. 2.

To begin, encoding process 200 identifies a dynamic range of the sampled values of an audio signal (step 201). The sampled values may correspond to units of measurement such as voltage, amperes, or power, in which case a conversion calculation to decibels may be performed in order to obtain the dynamic range in decibels. The dynamic range of an audio signal is a representation of the loudness of a recorded sound. For example, the dynamic range of a signal can be given as a ratio of the loudest sound to the softest sound expressed in decibels (dB) and sometimes is expressed as the difference (in dB) between the largest sampled value and the softest—which is normally zero. The largest sampled value likely occurs at the peak of the sinusoidal waveform of a signal. Identifying the dynamic range may therefore involve identifying the largest and smallest sampled values and determining the difference therebetween.

Next, encoding process 200 identifies a division of the dynamic range into a lower range and an upper range (step 203). The division of the dynamic range is determined based on a fixed mapping of a lower portion of the sampled values to a subset of quanta in a set of quanta having a depth less than the depth of the sampled values. In other words, the encoding process determines how much of the dynamic range is covered by the fix mapping. The point in the dynamic range where the fixed mapping stops is where the dynamic range can be divided. The division of the dynamic range may be calculated in terms of decibels but may also be calculated in terms of a unit of measurement of the audio data. In such scenarios, a conversion calculation from decibels to the unit of measurement may be performed (and vice-versa when needed).

The fixed mapping may occur on the basis of any ratio or correspondence of sampled values to quanta. For example, the fixed mapping may map sampled values to quanta on a 1:1 basis, a 2:1 basis, a 3:1 basis, or more. The mapping ratio may also vary on a per-quanta basis and can be determined empirically, algorithmically, and/or using a machine learning model. In such scenarios, the demarcation line at which to divide the dynamic range is not known a priori but rather is identified once the extent of the fixed mapping has been determined.

In other scenarios, the number of quanta and their relative spacing may be known a priori, in which case the size of the lower range would also be known. For example, k-number of quanta may be allocated to the lower range at a spacing of n-dB. The size of the lower range would therefore be k-times-n decibels and the demarcation between the lower and upper range would be set at that value. In a variation, the spacing of the quanta allocated to the lower range could be varied algorithmically, empirically, or via machine learning, but the general principal would remain the same that the size of the lower range could be calculated a priori.

In both cases, the size of the upper range would depend on the maximum of the sampled values and the size of the lower range. In simple terms, the size of the upper range would be calculated based on the difference between the maximum value in the samples and the maximum value of the samples in the lower range covered by the fixed mapping.

Encoding process 200 then proceeds to identify an adaptive mapping of the upper range of the dynamic range to a remainder of the quanta in the set of quanta (step 205). How many quanta remain may vary depending upon how many quanta were used by the fixed mapping and how many total quanta are available per a given encoding scheme. For instance, an 8-bit scheme allows for 128 total quanta. Assuming 22 quanta are allocated to the fixed mapping process, 106 quanta would remain for the adaptive mapping. If 20 quanta were allocated to the fixed mapping process, then 108 would remain for the adaptive mapping, and so on.

In addition to determining how many quanta to allocate to the adaptive mapping, encoding process 200 may also determine how to space the quanta in the domain of the audio signal. For instance, the quanta could be spaced evenly such that each value is separated from the next value by the same distance (in dB). In another example, the quanta could be spaced apart by progressively greater distances, by random distances, or otherwise. Such spacing could be determined algorithmically, empirically, or using a machine learning model.

Having identified the fixed and adaptive mapping schema to be applied, encoding process 200 encodes the lower portion of the sampled values based on the fixed mapping (step 207) and encodes the upper portion of the sampled values based on the adaptive mapping (step 209). The fixed mapping includes, for a given value in a lower portion of the sampled values, identifying a corresponding value in the set of quanta (in the case of 1:1 mapping) or a nearest value in the set of quanta (in the case of many-to-one mapping) and writing the identified value to an audio file. The adaptive mapping includes, for a given value in the upper portion of the sampled values, identifying a nearest value in the set of quanta and writing the identified value to the same file. The file may then be installed on a device to be decoded and played-out at runtime to indicate the operational state of the device, for example.

Referring back to FIG. 1, encoding scenario 150 provides a highly simplified example implementation of encoding process 200. With respect to encoding scenario 150, encoding process 200 examines the sampled values in file 105 to identifying a dynamic range of audio signal 101. The dynamic range 152 in this example ranges from sampled value $s\text{-}v_1$, to sampled value $s\text{-}v_9$. The size of the dynamic range is therefore $s\text{-}v_9$ less $s\text{-}v_1$ (or $s\text{-}v_9\text{-}0$). Encoding process 200 divides the dynamic range 152 into a lower range 155 and an upper range 156 based on the fixed mapping 153 of a lower portion of the dynamic range to a subset of quanta. Here, sampled values $s\text{-}v_1$ to $s\text{-}v_3$ map on a 1:1 basis to encoding quanta $e\text{-}q_1$ to encoding quanta $e\text{-}q_3$, although other spacing is possible as discussed above.

Further in this example, it is assumed for exemplary purposes that there are six possible encoding quanta $e\text{-}q_1$ to $e\text{-}q_6$. Accordingly, three encoding quanta remain after having allocated the first three quanta to lower range 155. Adaptive mapping 154 maps the remaining sampled values in the upper range 156 to the adaptive quanta 158 represented by the three remaining quanta. In this example, adaptive mapping 154 occurs on a 2:1 basis (two sampled values for every quantized value), although a variety of mapping schema may be used as discussed above.

As sampled values 151 are read from file 105, the sampled values are mapped per the fixed mapping 153 and the adaptive mapping 154 to the fixed quanta 157 and adaptive quanta 158 respectively. The encoded values 159 that result are written to file 115, along with a key 116 that describes the mapping. In this example, sampled values 151 include in order: $s\text{-}v_1$, $s\text{-}v_3$, $s\text{-}v_3$, $s\text{-}v_7$, and $s\text{-}v_9$. Sampled values 151 map to encoded values 159 which include in order: $e\text{-}q_1$, $e\text{-}q_3$, $e\text{-}q_5$, $e\text{-}q_5$, $e\text{-}q_6$. It may be appreciated that encoded values 159 require less storage since they have a depth less than that of sampled values 151. However, some fidelity has been lost as can be seen by the repeated value of $e\text{-}q_5$ for both $s\text{-}v_6$ and $s\text{-}v_7$.

Figure 3:
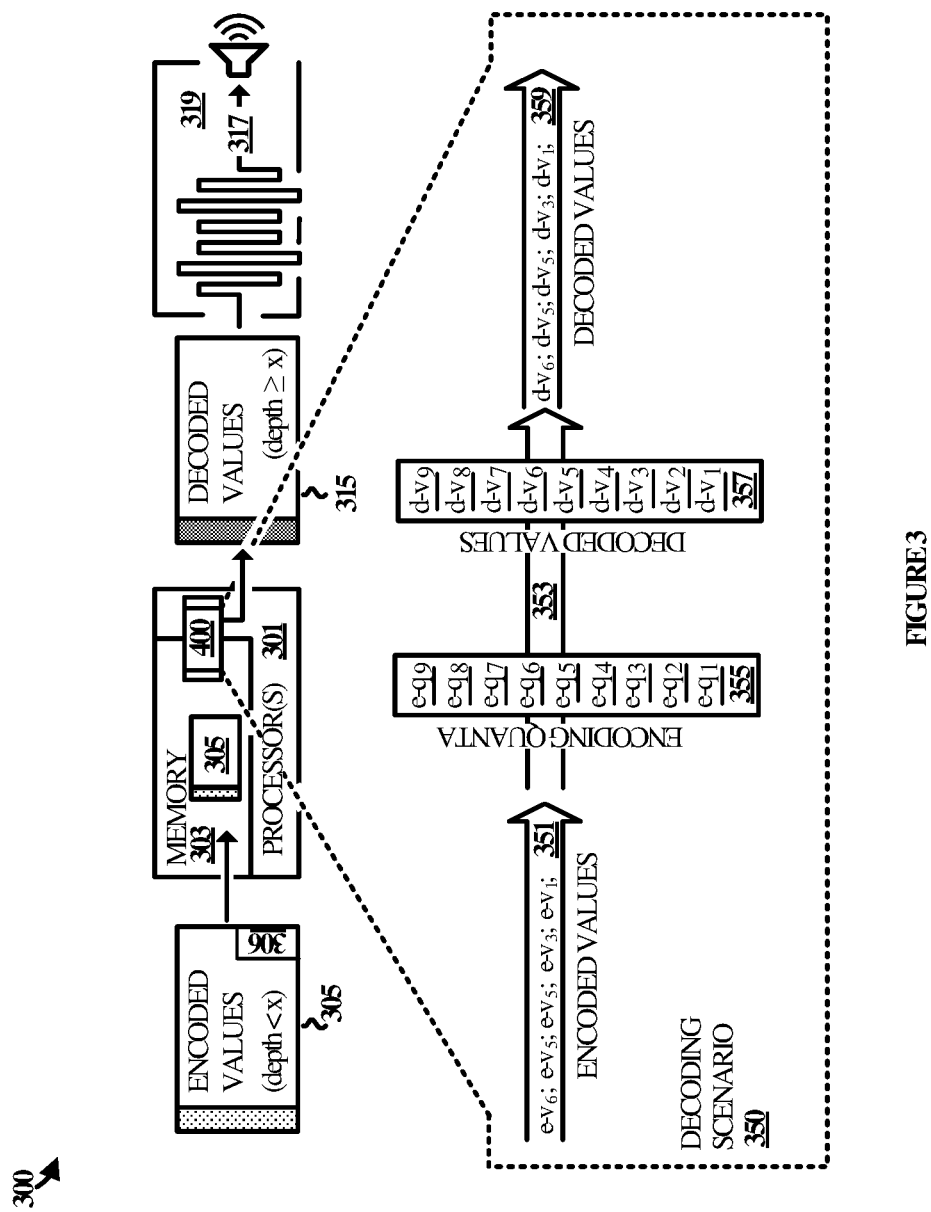
FIG. 3 illustrates an operational environment and a related scenario in an implementation of decompression or expansion.

FIG. 3 illustrates operational environment 300 in another implementation. Operational environment 300 includes one or more processors, represented by processor 301, coupled with memory 303. Operational environment 300 also includes an audio sub-system 319 capable of playing out an audible signal. Processor 301 is representative of any processor capable of decompressing an audio file such as a microcontroller. Memory 303 is representative of any type of microcontroller memory capable of storing an audio file such as SRAM, FLASH, and EEPROM memories. Processor 301, memory 303, and audio sub-system 319 may be implemented in a variety of devices such as computers, gaming consoles, home appliances, robotic appliances, greeting cards having audio features, and the like.

In operation, audio file 305 is stored in a portion of memory 303 capable of persisting the data in powered-off states. Audio file 305 includes encoded values having a depth less than "x." It may be assumed that the values were encoded by an encoding process the same as or similar to encoding process 200. Thus, some of the encoded values were produced by a fixed mapping process, while others were produced by an adaptive mapping process.

Audio file 305 also includes a key 306 for converting the encoded values to decoded values having a depth at least greater than the depth of the encoded values. For instance, the new depth may be equal to or greater than x but could also be less than x if still greater than the depth of the encoded values. Examples of key 306 include a table that maps the encoded values (or encoding quanta) to decoded values. Key 306 may be a one-dimensional list in some scenarios where the order of the decoded values implicitly identifies their corresponding quantized value without having to explicitly express the correspondence.

Figure 4:
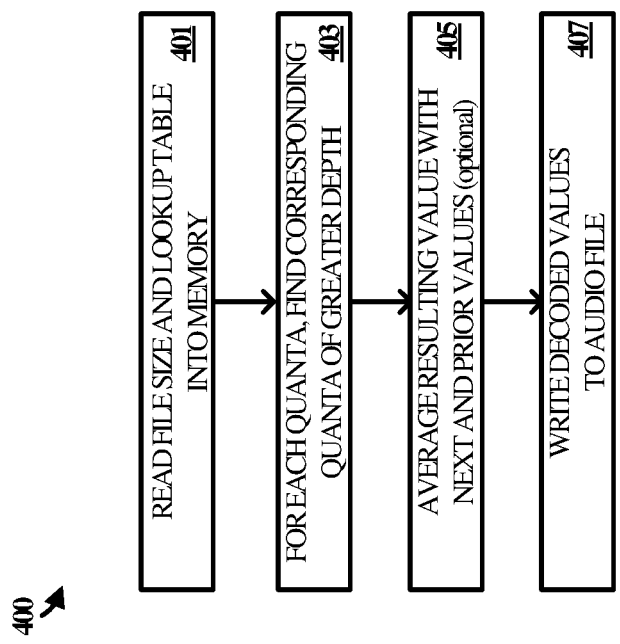
FIG. 4 illustrates a decoding processing in an implementation.

FIG. 4 illustrates a decoding process 400 that may be implemented in program instructions in the context of the hardware, firmware, and/or software on processor 301. The program instructions, when executed by processor 301, direct processor 301 and/or the media device within which processor 301 is deployed to operate as described for decoding process 400, referring parenthetically to the steps illustrated in FIG. 4.

To begin, processor 301 reads the file size for audio file 305 into a portion of memory 303 that may be read from and written to by processor 301 (step 401). Processor 301 also writes the look-up table or list represented by key 306 to this portion of memory 303 which may sometimes be referred to as scratch-pad memory.

For each encoded value in audio file 305, processor 301 proceeds to find its corresponding decoded value of greater depth using key 306 (step 403). This may be accomplished by, for instance, finding the encoded value in a look-up table and, from there, finding its corresponding decoded value. In another example, this may be accomplished by finding the corresponding decoded value at a place in a list represented by the encoded value.

Optionally, processor 301 may average the decoded value with one or more of the previous decoded values and/or one or more of the next decoded values (step 405). The present, previous, or next decoded values may be weighted differently with respect to each other in the averaging to further increased the fidelity of the output decoded values.

Finally, processor 301 writes the decoded values to audio file 315 (step 407), which may be the same as, or different from, audio file 305. Audio sub-system 319 drives a speaker with the output signal 317 produced from the decoded values in audio file 315.

FIG. 4 also illustrates decoding scenario 350 in a highly simplified example of decoding process 400. In operation, decoding process 400 identifies the encoding quanta 355 and their corresponding decoded values 357 from the contents of audio file 305. The encoding quanta 355 include all of the quanta used to encode sampled values. The encoding quanta 355 are shown in decoding scenario 350, although it may be appreciated that they may be absent from key 306 in some scenarios, as discussed above, while still being known implicitly or logically to decoding process 400. The encoding quanta 355 in this scenario are represented by $e\text{-}q_1$ through $e\text{-}q_9$. The decoded values are represented by $d\text{-}v_1$ through $d\text{-}v_9$.

As encoded values 351 are read from audio file 305, the values are converted per mapping 353 to their corresponding decoded values which have a depth greater than the depth of the encoded values. In this example, encoded values 351 include in order: $e\text{-}v_1$, $e\text{-}v_3$, $e\text{-}v_5$, $e\text{-}v_5$, and $e\text{-}v_6$. Mapping 353 produces decoded values 359 which include in order: $d\text{-}v_6$, $d\text{-}v_5$, $d\text{-}v_5$, $d\text{-}v_3$, and $d\text{-}v_1$. As mentioned, the decoded values may be further enhanced with various degrees of weighting and interpolation to as to further improve their fidelity to the original signal. The decoded values 359 are written to audio file 315 for play out by audio sub-system 319.

Figure 5:
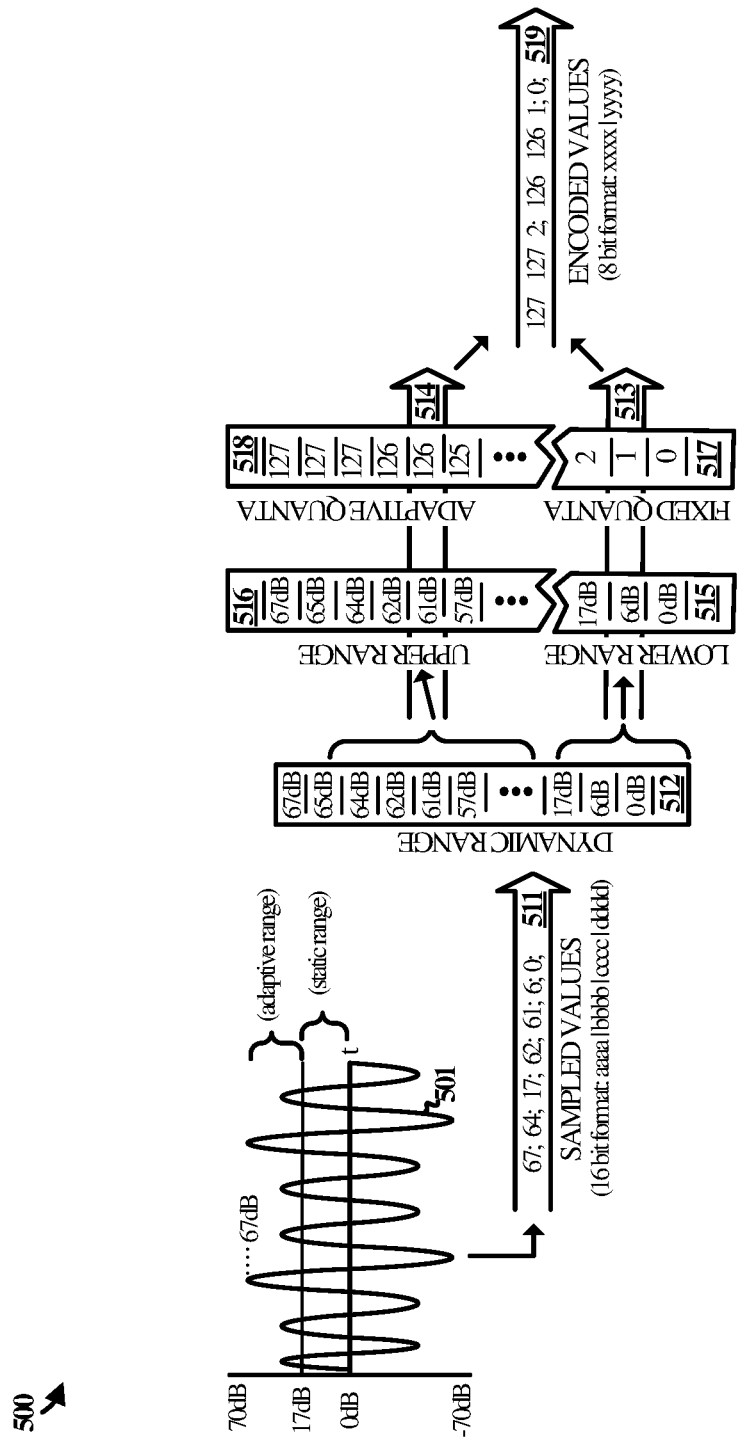
FIG. 5 illustrates an example of audio data encoding in an implementation.

FIG. 5 illustrates another operational scenario 500 in an example of encoding process 200 as applied to an audio signal 501. It may be appreciated that the bottom half is a reflection of the top half and the same or similar principals apply with respect to encoding the bottom of the signal.

Audio signal 501 is representative of an analog audio signal that can be digitally sampled and stored in an audio file such as a PCM file, a WAV file, or the like. Audio signal 501 has a sinusoidal waveform in the time domain with a peak value of 67 dB. In operation, an encoding device employing encoding process 200 identifies the dynamic range of audio signal 501 from the sampled values in the audio file. In this example, the dynamic range 512 extends from 0 dB up to 67 dB for the top half of the waveform.

It is assumed for exemplary purposes that sampled values are in a 16-bit binary format capable of representing approximately 32,000 different values in the top half of the signal. Dynamic range 512 includes one instance of each of the values that were sampled from audio signal 501. For example, the bottom of the range includes the values: 0 dB, 6 dB, and 17 dB. The top of the range includes: 57 dB, 61 dB, 62 dB, 64 dB, 65 dB, and 67 dB. It may be appreciated that the values are given in decimal notation but represent 16-bit binary numbers.

The encoding device employing encoding process 200 proceeds to divide the dynamic range 512 into a lower range 515 and an upper range 516. This may be accomplished by first determining how much of the dynamic range 512 is covered by a fixed mapping 513. Here, fixed mapping 513 maps values in the lower portion of dynamic range 512 to fixed quanta 517, which are referred to as such because they are used for fixed mapping. The point in dynamic range 512 where fixed mapping 513 stops is where dynamic range 512 can be divided.

The fixed mapping 513 may occur on the basis of any ratio or correspondence of sampled values to quanta such as 1:1, 2:1, 3:1, and so on. The mapping ratio may also vary on a per-quanta basis and can be determined empirically, algorithmically, and/or using a machine learning model. In such scenarios, the demarcation line at which to divide the dynamic range is identified once the extent of the fixed mapping has been determined. Alternatively, the number of quanta and their relative spacing may be known ahead of time, in which case the size of the lower range would also be known.

In both cases, the size of upper range 516 would depend on the maximum of the sampled values and the size of the lower range 515. In other words, the size of the upper range would be calculated based on the difference between the maximum value in the samples and the maximum value of the samples in the lower range covered by the fixed mapping.

In this example scenario, a 1:1 mapping is used to map sampled values to encoding quanta: 0 db maps to 0; 6 dB maps to 1; and 17 dB maps to 2. The fixed mapping 513 expends its quanta at 17 dB. Accordingly, dynamic range 512 is split into the lower and upper ranges at 17 dB. It may be appreciated that the fixed quanta 517 and the adaptive quanta 518 are given in decimal notation but represent 8-bit binary values. As such, the encoding values have a bit depth (8) that is half the depth of the sampled values (16).

The encoding device proceeds to identify an adaptive mapping 514 of the upper range 516 of the sampled values to a remainder of the quanta represented by adaptive quanta 518, which are referred to as such because they are used for adaptive mapping. How many quanta remain may vary depending upon how many quanta were used by the fixed mapping and how many total quanta are available per a given encoding scheme. It is assumed here that an 8-bit scheme is used which allows for 128 total quanta. Since 3 values were used to encode the lower range 515, 125 values remain to encode the upper range 516. If the schema had called for using 22 values to encode the lower range 515, then 106 quanta would remain to be allocated to the adaptive mapping.

In addition to determining how many quanta to allocate to the adaptive mapping 514, encoding process 200 may also determine how to space the quanta in the domain of the audio signal. For instance, the quanta could be spaced evenly such that each value is separated from the next value by the same distance (in dB). In another example, the quanta could be spaced apart by progressively greater distances, by random distances, or otherwise. Such spacing could be determined algorithmically, empirically, or using a machine learning model.

Having identified the fixed and adaptive mapping schema to be applied, encoding process 200 encodes the lower range 515 via fixed mapping 513 to fixed quanta 517 and encodes the upper range 516 to adaptive quanta 518. The fixed mapping includes, for a given value in a lower portion of the sampled values, identifying a corresponding value in the set of quanta (in the case of 1:1 mapping) or a nearest value in the set of quanta (in the case of many-to-one mapping) and writing the identified value to an audio file. The adaptive mapping includes, for a given value in the upper portion of the sampled values, identifying a nearest value in the set of quanta and writing the identified value to the same file. The file may then be installed on a device to be decoded and played-out at runtime to indicate the operational state of the device, for instance. In this example scenario, the fixed and adaptive mapping of sampled values 511 in a 16-bit format to quanta in an 8-bit format results in encoded values 519. Namely: 0 dB maps to 0; 6 dB maps to 1; 61 dB maps to 126; 62 dB maps to 126; 17 dB maps to 2; 64 dB maps to 127; and 67 dB maps to 127.

Figure 6:
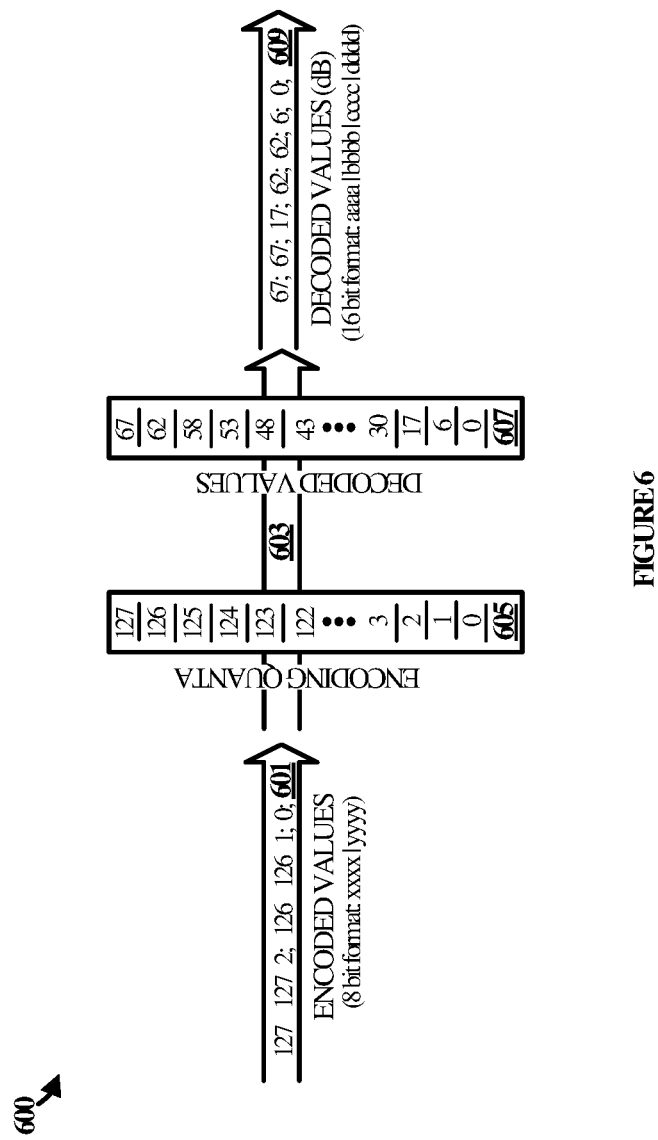
FIG. 6 illustrates an example of audio data decoding in an implementation.

FIG. 6 illustrates an operational scenario 600 to illustrate an implementation of decoding process 400. In operation, an encoding process has produced a set of encoded values in an audio file. The values are read out of the file and are represented by encoded values 601. In addition, the decoding process (implemented on a microcontroller, for example), identifies a set of encoding quanta 605, from data in the file or implicitly, as well as a mapping 603 of the quanta to decoded values 607. The decoding process maps the incoming encoded values directly to the decoded values based on mapping 603.

For example, the set of encoding quanta includes 8-bit values represented in decimal notation ranging from 0 to 127. The decoded values 607 include 128 16-bit values represented in decimal notation. Mapping 603 maps each one of the encoding quanta to a different one of the decoded values 607. The result is a set of decoded values represented by decoded values 609. More specifically, encoded values 601 produce decoded values 609 as follows: 0 maps to 0 dB; 1 maps to 6 dB; 126 maps to 62 dB; 126 maps to 62 dB; 127 maps to 67 dB; and 127 again maps to 67 dB.

Figure 7:
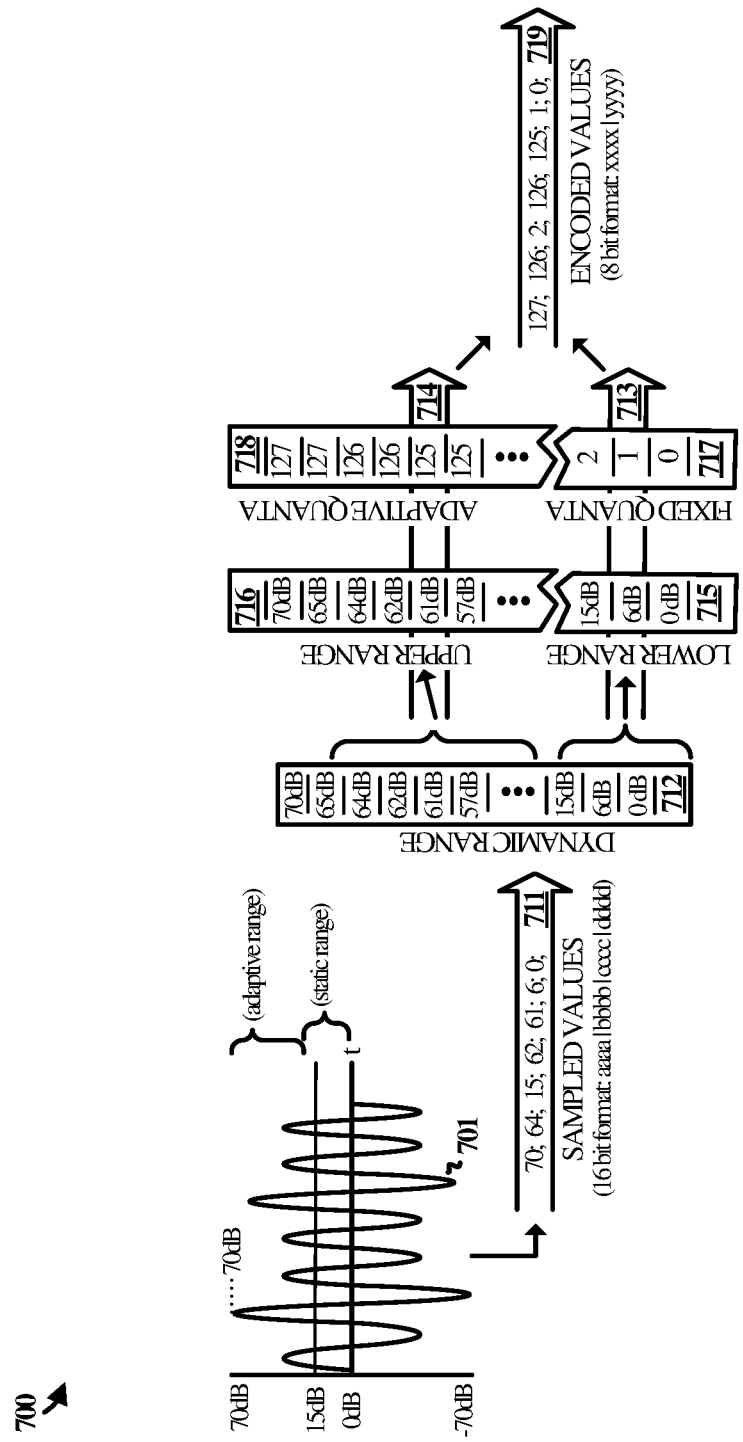
FIG. 7 illustrates an example of audio data encoding in an implementation.

FIG. 7 illustrates operational scenario 700 in another example of encoding process 200 as applied to an audio signal 701. It may be appreciated that the bottom half is a reflection of the top half and the same or similar principals apply with respect to encoding the bottom of the signal. It may also be appreciated the audio signal 701 differs from audio signal 501 in FIG. 5 with respect to its maximum value (70 dB vs. 67 dB). This difference can have the effect of changing the demarcation point at which the lower range is separated from the upper range. In other words, the same fixed mapping schema, when applied to two different signals, results in different adaptive mapping for each of the signals.

Audio signal 701 in operational scenario 700 is representative of an analog audio signal that can be digitally sampled and stored in an audio file such as a PCM file, a WAV file, or the like. Audio signal 701 has a sinusoidal waveform in the time domain with a peak value of 70 dB. In operation, an encoding device employing encoding process 200 identifies the dynamic range of audio signal 701 from the sampled values in the audio file. In this example, the dynamic range 712 extends from 0 dB up to 70 dB for the top half of the waveform.

It is assumed for exemplary purposes that the sampled values are in a 16-bit binary format. Dynamic range 712 includes one instance of each of the values that were sampled from audio signal 701. For example, the bottom of the range includes the values: 0 dB, 6 dB, and 15 dB. The top of the range includes: 57 dB, 61 dB, 62 dB, 64 dB, 65 dB, and 67 dB. It may be appreciated that the values are given in decimal notation even though they represent 16-bit binary numbers. Note also that the values in the lower portion of the range differ by at least one value from those in the lower portion of dynamic range 512. This is because audio signal 701 differs from audio signal 501 (assuming the same sampling rate).

Encoding process 200 proceeds to divide the dynamic range 712 into a lower range 715 and an upper range 716. This may be accomplished by first determining how much of the dynamic range 712 is covered by a fixed mapping 713. Here, fixed mapping 713 maps values in the lower portion of dynamic range 712 to fixed quanta 717. The point in dynamic range 712 where the fixed mapping stops is where the dynamic range can be divided.

The fixed mapping 713 may occur on the basis of any ratio or correspondence of sampled values to quanta such as 1:1, 2:1, 3:1, and so on. The mapping ratio may also vary on a per-quanta basis and can be determined empirically, algorithmically, and/or using a machine learning model. In such scenarios, the demarcation line at which to divide the dynamic range is identified once the extent of the fixed mapping has been determined. Alternatively, the number of quanta and their relative spacing may be known ahead of time, in which case the size of the lower range would also be known.

In both cases, the size of upper range 716 would depend on the maximum of the sampled values and the size of the lower range 715. In other words, the size of the upper range would be calculated based on the difference between the maximum value in the samples and the maximum value of the samples in the lower range covered by the fixed mapping.

In this example scenario, a 1:1 mapping is used to map sampled values to encoding quanta: 0 db maps to 0; 6 dB maps to 1; and 15 dB maps to 2. The fixed mapping therefore expends its quanta at 15 dB, whereas the fixed mapping in FIG. 5 completed at 17 dB. Accordingly, dynamic range 712 is split into the lower and upper ranges at 15 dB. It may be appreciated that the fixed quanta 717 and the adaptive quanta 718 are given in decimal notation but represent 8-bit binary values. As such, the encoding values have a bit depth (8) that is half that of the sampled values (16).

The encoding device proceeds to identify an adaptive mapping 714 of the upper range 716 of sampled values to a remainder of the quanta represented by adaptive quanta 718. How many quanta remain may vary depending upon how many quanta were used by the fixed mapping and how many total quanta are available per a given encoding scheme. It is assumed here that an 8-bit scheme is used which allows for 128 total quanta. Since 3 values were used to encode the lower range 715, 125 values remain to encode the upper range 716.

In addition to determining how many quanta to allocate to the adaptive mapping 714, encoding process 200 may also determine how to space the quanta in the domain of the audio signal. For instance, the quanta could be spaced evenly such that each value is separated from the next value by the same distance (in dB). In another example, the quanta could be spaced apart by progressively greater distances, by random distances, or otherwise. Such spacing could be determined algorithmically, empirically, or using a machine learning model.

Having identified the fixed and adaptive mapping schema to be applied, encoding process 200 encodes the lower range 715 with the fixed mapping 713 to fixed quanta 717 and encodes the upper range 716 using adaptive mapping 714 and adaptive quanta 718. The fixed mapping 713 includes, for a given value in a lower portion of the sampled values, identifying a corresponding value in the set of quanta (in the case of 1:1 mapping) or a nearest value in the set of quanta (in the case of many-to-one mapping) and writing the identified value to an audio file. The adaptive mapping includes, for a given value in the upper portion of the sampled values, identifying a nearest value in the set of quanta and writing the identified value to the same file. The file may then be installed on a device to be decoded and played-out at runtime to indicate the operational state of the device, for example. In this example scenario, the fixed and adaptive mapping of sampled values 711 in a 16-bit format to quanta in an 8-bit format results in encoded values 719. Namely: 0 dB maps to 0; 6 dB maps to 1; 61 dB maps to 125; 62 dB maps to 126; 15 dB maps to 2; 64 dB maps to 126; and 70 dB maps to 127.

Figure 8:
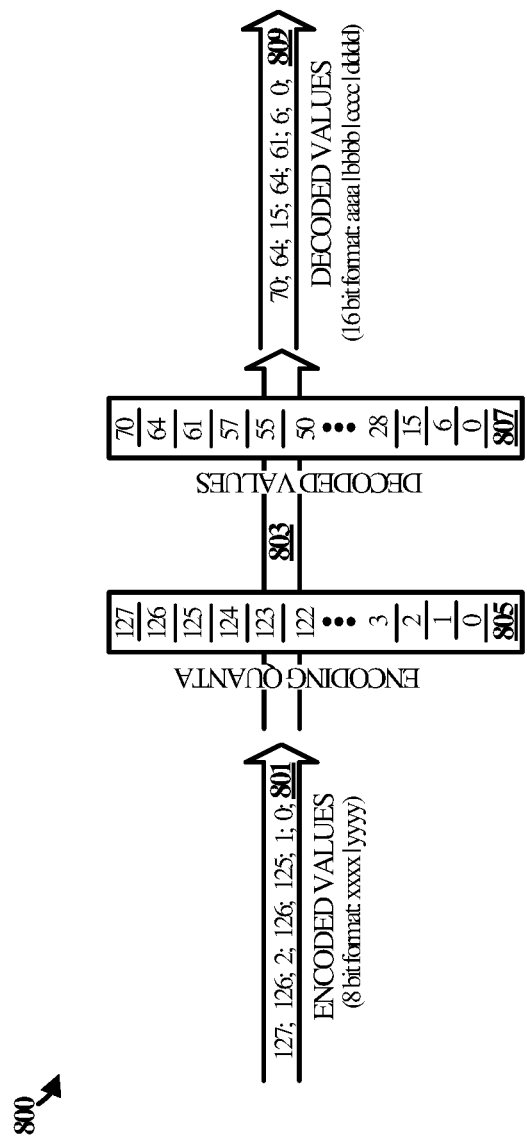
FIG. 8 illustrates an example of audio data decoding in an implementation.

FIG. 8 illustrates an operational scenario 800 to illustrate an implementation of decoding process 400. In operation, an encoding process has produced a set of encoded values in an audio file. The values are read out of the file and are represented by encoded values 801. In addition, the decoding process (implemented on a microcontroller, for example), identifies a set of encoding quanta 805, from data in the file or implicitly, as well as a mapping 803 of the quanta to decoded values 807. The decoding process maps the incoming encoded values directly to the decoded values based on mapping 803.

For example, the set of encoding quanta includes 8-bit values represented in decimal notation ranging from 0 to 127. The decoded values 807 include 128 16-bit values represented in decimal notation. Mapping 803 maps each one of the encoding quanta to a different one of the decoded values 807. The result is a set of decoded values represented by decoded values 809. More specifically, encoded values 801 produce decoded values 809 as follows: 0 maps to 0 dB; 1 maps to 6 dB; 125 maps to 61 dB; 126 maps to 64 dB; 2 maps to 15 dB; 126 maps to 64 dB; and 127 maps to 70 dB.

Figure 9A:
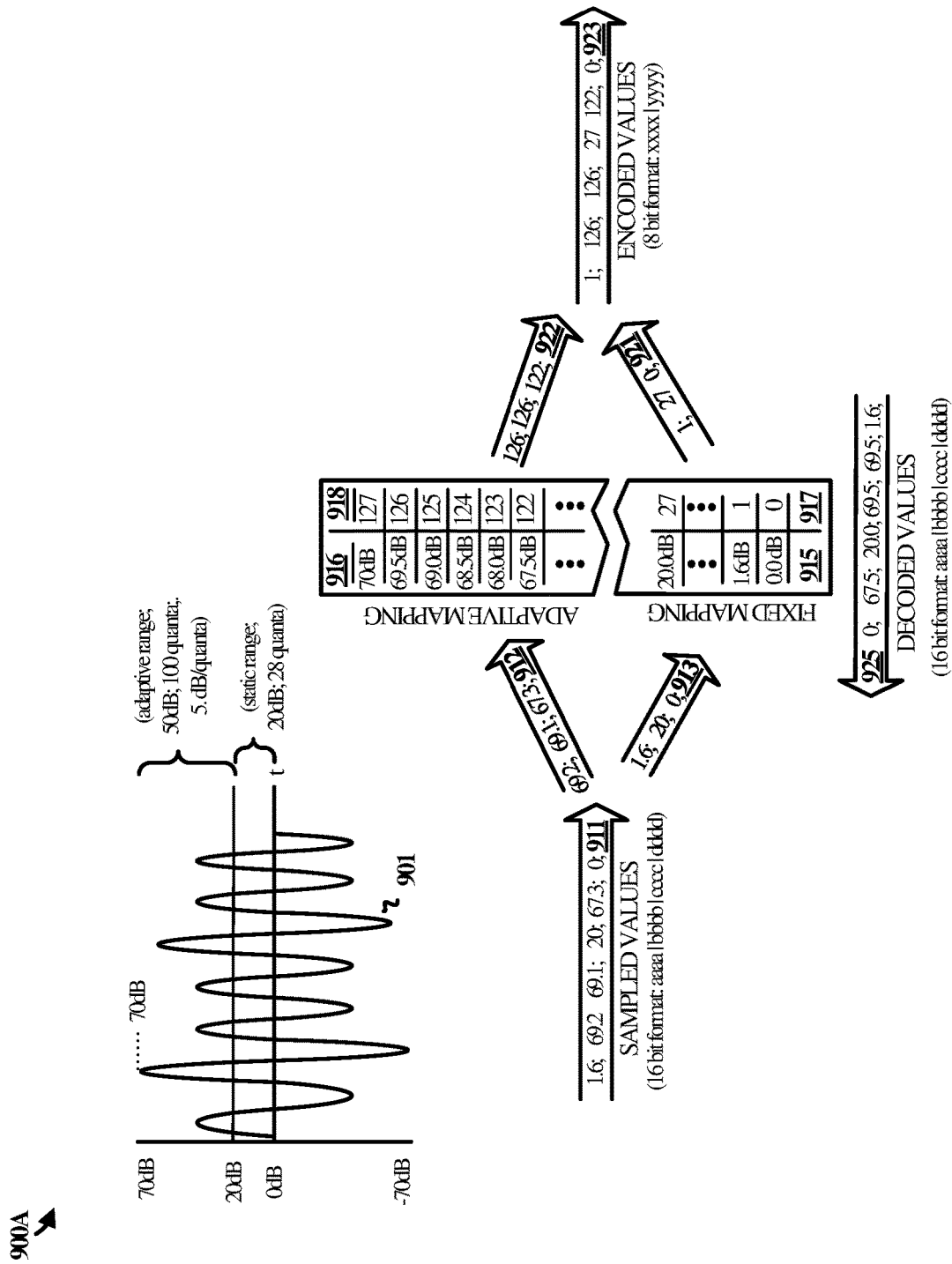
FIGS. 9A and 9B illustrate examples of fixed and adaptive mapping.
Figure 9B:
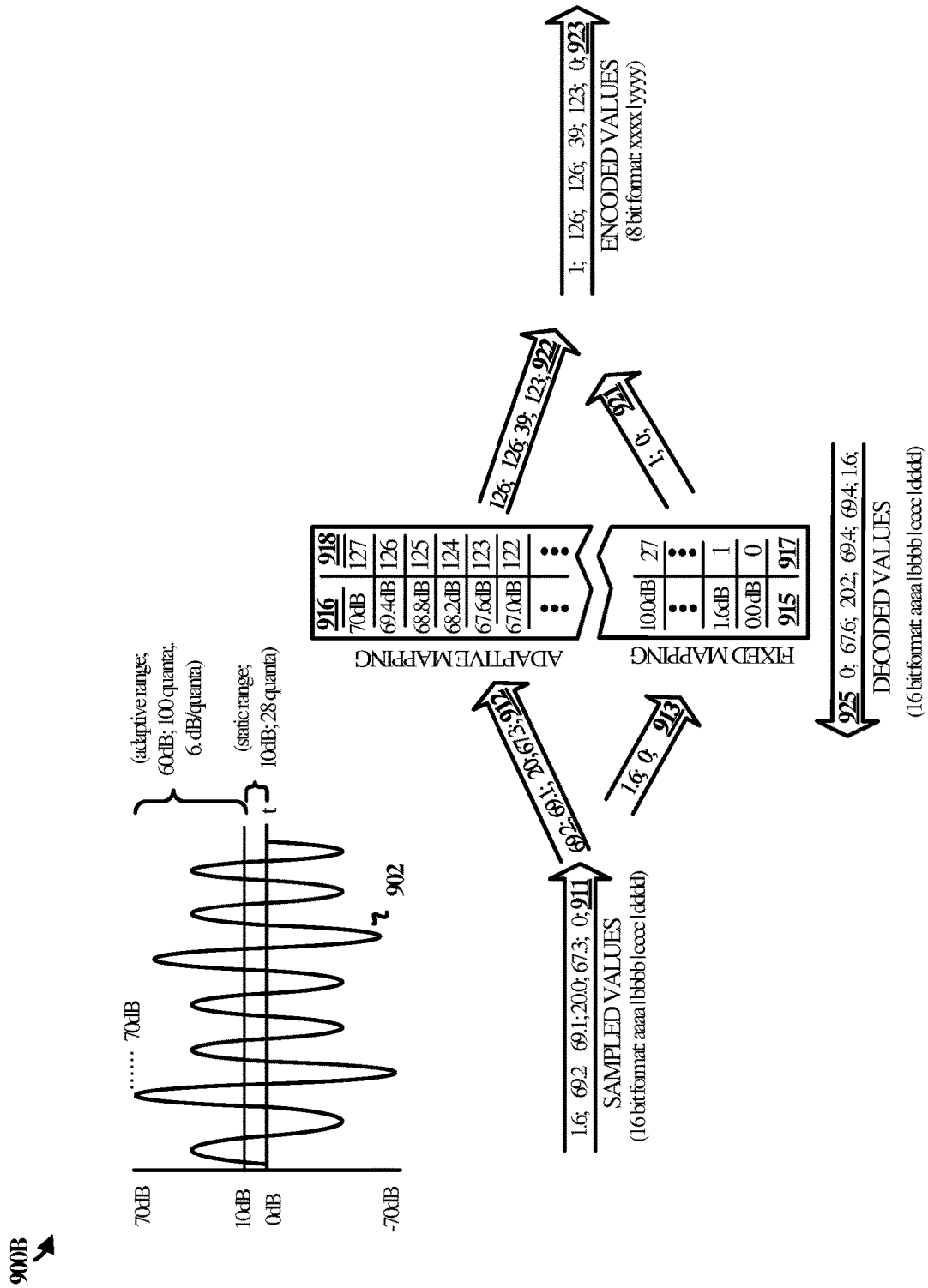

FIGS. 9A and 9B illustrate two related scenarios to better appreciate fixed and adaptive mapping. In these scenarios, fixed mapping is accomplished by mapping the lowest n-number of sampled values to the first n-number of quanta. It is assumed for both scenario 900A and scenario 900B that 128 8-bit quanta are possible and n=28. The lowest 28 values in a set of sampled values therefore maps to the lower 28 quanta. The remaining 100 quanta are allocated to the adaptive mapping process.

The adaptive mapping process in both scenarios allocates the remaining quanta evenly in the logarithmic domain across the upper range of sampled values. In FIG. 9A, the dynamic range extends a total of 70 dB and the fixed quanta cover 20 dB of the range, leaving 50 dB of range remaining to be covered by the adaptive quanta. An even spacing of the adaptive quanta in the logarithmic domain results in a 0.5 dB spread for each one of the remaining quanta.

In contrast, the dynamic range in FIG. 9B also extends to 70 dB, but the fixed quanta cover only 10 dB of the range, leaving 60 dB remaining for the adaptive quanta. An even spacing of the adaptive quanta results in a 0.6 dB spread for each one of the 100 remaining quanta.

In FIG. 9A, scenario 900A includes audio signal 901, which has a static or fixed range that extends from 0 dB to 20 dB. Its adaptive range extends from 20 dB to 70 dB. The fixed range is determined by mapping, on a 1:1 basis, the first twenty-eight (28) quanta to the lowest 28 sampled values. It is assumed for exemplary purposes that such mapping covers the sampled values up to 20 dB.

As the first twenty-eight quanta are allocated on a fixed basis to the lowest twenty-eight sampled values, one-hundred quanta remain to be allocated to adaptive mapping. An even distribution of the one-hundred quanta is assumed in this example, meaning that the remaining 50 dB of range can be mapped at increments of 0.5 dB to the one-hundred quanta. Then, as sampled values flow through the mapping(s), they are mapped either based on the 1:1 mapping for the lower range of values or via the evenly-spaced mapping for the upper range.

As an example, sampled values 911 flow through either the fixed mapping or the adaptive mapping. Values 20 dB or less (913) are mapped per the fixed mapping, while values greater than 20 dB (912) are mapped per the adaptive mapping. The fixed mapping maps specific values 915 to specific fixed quanta 917. The adaptive mapping maps 0.5 dB ranges of values 916 to specific quanta 918, which may be referred to as adaptive quanta.

The sampled values in the fixed range are mapped by finding their corresponding value in values 915 and then identifying the corresponding quanta in fixed quanta 917. The sampled values in the upper range are mapped by finding the group or range of values within which the sampled value falls and then finding the quanta corresponding to that group or range. Here, the groups are labeled based on the highest member of the group, although any nomenclature could be used. For example, the value 69.1 dB belongs to the group labeled with 69.5 dB, as does the value 69.2, whereas the value 67.3 belongs to the group labeled 67.5. Accordingly, the three values map to 126, 126, and 122 respectively, illustrated by encoded values 922. The values from the lower range map to values 921 (0, 27, and 1). The combined result is sequence of numbers represented in encoded values 923.

The sampled values have 16-bit binary formats, whereas the encoded values 923 have an 8-bit format. A 1:1 mapping is utilized in the reverse direction to decode the 8-bit encoded values into 16-bit decoded values. Here, the decoded values 917 are 0, 67.5, 20.0, 69.5, 69.5, and 1.6, all in decibels.

FIG. 9B illustrates how differences in signal characteristics or even the characteristics of sampled values can change how audio data is encoded. In scenario 900B, audio signal 902 has a static or fixed range that extends from 0 dB to 10 dB (as opposed to 20 dB in scenario 900A). Its adaptive range therefore extends from 10 dB to 70 dB. The fixed range is determined by mapping, on a 1:1 basis, the first twenty-eight (28) quanta to the lowest 28 sampled values. It is assumed for exemplary purposes that such mapping covers the sampled values up to 10 dB.

As the first twenty-eight quanta are allocated on a fixed basis to the lowest twenty-eight sampled values, one-hundred quanta remain to be allocated to adaptive mapping. An even distribution of the one-hundred quanta is assumed in this example, meaning that the remaining 60 dB of range can be mapped at increments of 0.6 dB to the one-hundred quanta. Then, as sampled values flow through the mapping(s), they are mapped either based on the 1:1 mapping for the lower range of values or via the evenly-spaced mapping for the upper range.

As an example, sampled values 911 flow through either the fixed mapping or the adaptive mapping. Values 10 dB or less (913) are mapped per the fixed mapping, while values greater than 10 dB (912) are mapped per the adaptive mapping. The fixed mapping maps specific values 915 to specific fixed quanta 917. The adaptive mapping maps 0.6 dB ranges of values 916 to specific quanta 918, which may be referred to as adaptive quanta.

The sampled values in the fixed range are mapped by finding their corresponding value in values 915 and then identifying the corresponding quanta in fixed quanta 917.

The sampled values in the upper range are mapped by finding the group or range of values within which the sampled value falls and then finding the quanta corresponding to that group or range. Here, the groups are labeled based on the highest member of the group, although any nomenclature could be used. For example, the value 69.1 dB belongs to the group labeled with 69.4 dB, as does the value 69.2, whereas the value 67.3 belongs to the group labeled 67.6. Accordingly, the three values map to 126, 126, and 123 respectively, illustrated by encoded values 922. The values from the lower range map to encoded values 921 (0 and 1). The combined result is encoded values 923.

The sampled values have 16-bit binary formats, whereas the encoded values 923 have an 8-bit format. A 1:1 mapping is utilized in the reverse direction to decode the 8-bit encoded values into 16-bit decoded values. Here, the decoded values 925 are 0, 67.6, 20.2, 69.4, 69.4, and 1.6, all in decibels.

While the values in FIGS. 1-9B are given in decibels, it may be appreciated that the same or similar concepts would apply if the values were given in voltage, amperes, power, or any other unit of measurement. Conversions between units of measurement and decibels may be calculated in order to, for example, translate an even spacing of adaptive quanta to the units of measurement in which audio data is encoded. Either the sampled values in the audio data can be converted from a unit of measurement to decibels (and the encoded data can be converted from decibels to the unit of measurement), or the fixed and adaptive mapping can be expressed in terms of the unit of measurement.

For example, an audio file that contains sampled values representative of voltage could be encoded using fixed and adapative quanta also expressed in voltage. Assuming x-total number of quanta, n-number of fixed quanta, and k=x-n number of adaptive quanta, the lowest n-number of sampled voltage values are mapped to the lowest n-number of quanta. The remaining k-number of sampled voltage values are mapped to k remaining quanta. However, the values of the remaining quanta must first be converted from decibels to voltage.

To do so, the log of the ratio of two voltage values (q1, q2) is given as equal to the spread in decibels (s) that is desired. A coefficient of 20 may also be multiplied times the log value. The denominator in the ratio is a known-quanta (q1) and the numerator is the unknown quanta (q2) that is next in an increasing series of adaptive quanta. The unknown quanta at each step can be solved for as follows:
  a. $20*\log(q2/q1)=s$ dB;
  b. $20*\text{inv}\log(q2/q1)=10\char`^s$
  c. $20*(q2/q1)=10\char`^s$
  d. $20*q2=(10\char`^s)*q1$
  e. $q2=[(10\char`^s)*q1]/20$ Various technical effects may be appreciated from the foregoing disclosure of enhanced compression—or "squanching"—of audio data such as the reduced size of an audio file that results from converting audio data from one depth to a lesser depth. The resulting audio file can thus be deployed to resource-constrained environments where storage space is at a premium. In addition, decoding the values in the audio file requires fewer processing cycles and/or less power than a typical decompression algorithm, making the strategies disclosed herein suitable for processing-constrained environments, applications, and scenarios.

In some implementations, the adaptive quanta are spaced evenly with respect to each other in the logarithmic (dB) domain. This technique has the technical effect of conserving quanta in the ranges most sensitive to human hearing, allowing those ranges to be encoded with greater fidelity than other ranges.

FIG. 10 illustrates computer architecture 1001 that is representative of any system or collection of systems in which the various processes, programs, services, and scenarios disclosed herein may be implemented. Examples of computing devices that may employ computer architecture 1001 include, but are not limited to, server computers, cloud computing platforms, and data center equipment, as well as any other type of physical or virtual server machine, container, and any variation or combination thereof. Other examples include desktop computers, laptop computers, table computers, Internet of Things (IoT) devices, wearable devices, and any other physical or virtual combination or variation thereof.

Computer architecture 1001 may be implemented as a single apparatus, system, or device or may be implemented in a distributed manner as multiple apparatuses, systems, or devices. Computer architecture 1001 includes, but is not limited to, processing system 1008, storage system 1003, software 1005, communication interface system 1007, and user interface system 1009 (optional). Processing system 1008 is operatively coupled with storage system 1003, communication interface system 1007, and user interface system 1009.

Processing system 1008 loads and executes software 1005 from storage system 1003. Software 1005 includes and implements encoding process 1006, which is representative of the encoding processes discussed with respect to the preceding Figures. When executed by processing system 1008 to enhance the user experience with respect to viewing changes in documents, software 1005 directs processing system 1008 to operate as described herein for at least the various processes, operational scenarios, and sequences discussed in the foregoing implementations. Computer architecture 1001 may optionally include additional devices, features, or functionality not discussed for purposes of brevity.

Referring still to FIG. 10, processing system 1008 may comprise a micro-processor and other circuitry that retrieves and executes software 1005 from storage system 1003. Processing system 1008 may be implemented within a single processing device but may also be distributed across multiple processing devices or sub-systems that cooperate in executing program instructions. Examples of processing system 1008 include general purpose central processing units, graphical processing units, application specific processors, and logic devices, as well as any other type of processing device, combinations, or variations thereof.

Storage system 1003 may comprise any computer readable storage media readable by processing system 1008 and capable of storing software 1005. Storage system 1003 may include volatile and nonvolatile, removable and non-removable media implemented in any method or technology for storage of information, such as computer readable instructions, data structures, program modules, or other data. Examples of storage media include random access memory, read only memory, magnetic disks, optical disks, flash memory, virtual memory and non-virtual memory, magnetic cassettes, magnetic tape, magnetic disk storage or other magnetic storage devices, or any other suitable storage media. In no case is the computer readable storage media a propagated signal.

In addition to computer readable storage media, in some implementations storage system 1003 may also include computer readable communication media over which at least some of software 1005 may be communicated internally or externally. Storage system 1003 may be implemented as a single storage device but may also be implemented across multiple storage devices or sub-systems co-located or distributed relative to each other. Storage system 1003 may comprise additional elements, such as a controller, capable of communicating with processing system 1008 or possibly other systems.

Software 1005 (including encoding process 1006) may be implemented in program instructions and among other functions may, when executed by processing system 1008, direct processing system 1008 to operate as described with respect to the various operational scenarios, sequences, and processes illustrated herein. For example, software 1005 may include program instructions for implementing an encoding process as described herein.

In particular, the program instructions may include various components or modules that cooperate or otherwise interact to carry out the various processes and operational scenarios described herein. The various components or modules may be embodied in compiled or interpreted instructions, or in some other variation or combination of instructions. The various components or modules may be executed in a synchronous or asynchronous manner, serially or in parallel, in a single threaded environment or multi-threaded, or in accordance with any other suitable execution paradigm, variation, or combination thereof. Software 1005 may include additional processes, programs, or components, such as operating system software, virtualization software, or other application software. Software 1005 may also comprise firmware or some other form of machine-readable processing instructions executable by processing system 1008.

In general, software 1005 may, when loaded into processing system 1008 and executed, transform a suitable apparatus, system, or device overall from a general-purpose computing system into a special-purpose computing system customized to provide enhanced processing of audio data. Indeed, encoding software 1005 on storage system 1003 may transform the physical structure of storage system 1003. The specific transformation of the physical structure may depend on various factors in different implementations of this description. Examples of such factors may include, but are not limited to, the technology used to implement the storage media of storage system 1003 and whether the computer-storage media are characterized as primary or secondary storage, as well as other factors.

For example, if the computer readable storage media are implemented as semiconductor-based memory, software 1005 may transform the physical state of the semiconductor memory when the program instructions are encoded therein, such as by transforming the state of transistors, capacitors, or other discrete circuit elements constituting the semiconductor memory. A similar transformation may occur with respect to magnetic or optical media. Other transformations of physical media are possible without departing from the scope of the present description, with the foregoing examples provided only to facilitate the present discussion.

Communication interface system 1007 may include communication connections and devices that allow for communication with other computing systems (not shown) over communication networks (not shown). Examples of connections and devices that together allow for inter-system communication may include network interface cards, antennas, power amplifiers, RF circuitry, transceivers, and other communication circuitry. The connections and devices may communicate over communication media to exchange communications with other computing systems or networks of systems, such as metal, glass, air, or any other suitable communication media. The aforementioned media, connections, and devices are well known and need not be discussed at length here.

Communication between computer architecture 1001 and other computing systems (not shown), may occur over a communication network or networks and in accordance with various communication protocols, combinations of protocols, or variations thereof. Examples include intranets, internets, the Internet, local area networks, wide area networks, wireless networks, wired networks, virtual networks, software defined networks, data center buses and backplanes, or any other type of network, combination of network, or variation thereof. The aforementioned communication networks and protocols are well known and need not be discussed at length here.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the disclosure. Those skilled in the art will also appreciate that the features described above may be combined in various ways to form multiple embodiments. As a result, the invention is not limited to the specific embodiments described above, but only by the claims and their equivalents.

What is claimed is:

1. A method for compressing sampled values of audio data having a dynamic range, the method comprising:
    identifying a fixed mapping of the sampled values in a lower range of the audio data to a subset of quanta in a set of quanta having a depth less than a depth of the sampled values;
    identifying a maximum value among the sampled values of audio data;
    identifying an upper range of the sampled values of the audio data remaining after the lower range, the upper range ending at the maximum value among the sampled values of audio data;
    identifying an adaptive mapping of the sampled values in the upper range to a remaining subset of quanta in the set of quanta; and
    encoding the sampled values in the lower range based on the fixed mapping; and
    encoding the sampled values in the upper range based on the adaptive mapping.

2. The method of claim 1 wherein identifying the upper range comprises:
    identifying a maximum value of the lower range; and
    dividing the dynamic range at the identified maximum value of the lower range into the lower range and the upper range.

3. The method of claim 1 wherein the subset of quanta comprises a fixed number of quanta and wherein, for at least some of the fixed number of quanta, the fixed mapping comprises a one-to-one mapping of the at least some of the fixed number of quanta to a same number of the sampled values.

4. The method of claim 1 wherein the remaining subset of quanta comprises a remaining number of quanta, and wherein the adaptive mapping comprises many-to-one mappings, for respective quanta of the remaining subset of quanta, of a remainder of the sampled values to the remaining number of quanta.

5. The method of claim 1 wherein encoding the sampled values in the lower range based on the fixed mapping comprises, for each value of the sampled values in the lower range, mapping the value to a corresponding one of the subset of quanta and writing the corresponding one of the subset of quanta to a file, the corresponding one of the subset of quanta having a corresponding decoded value nearest to the value of the sampled values in the lower range.

6. The method of claim 5 wherein encoding the sampled values in the upper range based on the adaptive mapping comprises, for each value of the sampled values in the upper range, mapping the value to a corresponding one of the remaining subset of quanta and writing the corresponding one of the remaining subset of quanta to the file, the corresponding one of the remaining subset of quanta having a corresponding decoded value nearest to the value of the sampled values in the upper range.

7. The method of claim 6 wherein the file further includes a key for mapping the set of quanta to a corresponding set of decoded values having a depth greater than the depth of the set of quanta.

8. The method of claim 7 wherein the depth of the set of quanta comprises 8 bits, the depth of the corresponding set of decoded values comprises 16 bits, and the depth of the sampled values comprises 16 bits.

9. The method of claim 1 wherein:
for the fixed mapping, each quanta of the subset of quanta maps to a different sampled value in the lower range; and
for the adaptive mapping, the remaining subset of quanta split the upper range according to a logarithmic scale.

10. A computing apparatus comprising:
one or more computer readable storage media;
one or more processors operatively coupled with the one or more computer readable storage media; and
program instructions stored on the one or more computer readable storage media that, when executed by the one or more processors, direct the computing apparatus to at least:
identify a dynamic range from sampled values of an audio signal, including identifying a maximum value among the sampled values of the audio signal;
identify a division of the dynamic range into at least a lower range and an upper range, the lower range being based at least on a fixed mapping of the sampled values in a lower portion of the dynamic range to a subset of quanta in a set of quanta having a depth less than a depth of the sampled values, and the upper range ending at the maximum value among the sampled values of the audio signal;
identify, based at least on a dimension of the upper range, an adaptive mapping of the sampled values in an upper portion of the dynamic range to a remaining subset of quanta in the set of quanta;
encode the sampled values in the lower portion of the dynamic range based on the fixed mapping; and
encode the sampled values in the upper portion of the dynamic range based on the adaptive mapping.

11. The computing apparatus of claim 10 wherein, to identify the division of the dynamic range into the lower range and the upper range, the program instructions direct the computing apparatus to at least:
identify a maximum value of the lower portion of the dynamic range; and
divide the dynamic range at the identified maximum value of the lower portion into the lower range and the upper range.

12. The computing apparatus of claim 10 wherein the subset of quanta comprises a fixed number of quanta and wherein, for at least some of the fixed number of quanta, the fixed mapping comprises a one-to-one mapping of the at least some of the fixed number of quanta to a same number of the sampled values.

13. The computing apparatus of claim 12 wherein the remaining subset of quanta comprises a remaining number of quanta and wherein the adaptive mapping comprises many-to-one mappings, for respective quanta of the remaining subset of quanta, of a remainder of the sampled values to the remaining number of quanta.

14. The computing apparatus of claim 10 wherein, to encode the sampled values in the lower portion of the dynamic range based on the fixed mapping, the program instructions direct the computing apparatus to, for each value of the sampled values in the lower portion of the dynamic range, map the value to a corresponding one of the subset of quanta and write the corresponding one of the subset of quanta to a file, the corresponding one of the subset of quanta having a corresponding decoded value nearest to the value of the sampled values in the lower portion of the dynamic range.

15. The computing apparatus of claim 14 wherein, to encode the sampled values in the upper portion of the dynamic range based on the adaptive mapping, the program instructions direct the computing apparatus to, for each value of the sampled values in the upper portion of the dynamic range, map the value to a corresponding one of the remaining subset of quanta and write the corresponding one of the remaining subset of quanta to the file, the corresponding one of the remaining subset of quanta having a corresponding decoded value nearest to the value of the sampled values in the upper portion of the dynamic range.

16. The computing apparatus of claim 15 wherein the file further includes a key for mapping the set of quanta to a corresponding set of decoded values having a depth greater than the depth of the set of quanta, wherein the depth of the set of quanta comprises 8 bits, the depth of the corresponding set of decoded values comprises 16 bits, and the depth of the sampled values comprises 16 bits.

17. The computing apparatus of claim 10 wherein:
for the fixed mapping, each quanta of the subset of quanta maps to a different sampled value in the lower portion of the dynamic range; and
for the adaptive mapping, the remaining subset of quanta split the upper portion of the dynamic range according to a logarithmic scale.

18. A computing apparatus comprising:
a memory having a file stored therein, wherein the file comprises encoded versions of sampled values of an audio signal, wherein the encoded versions of the sampled values comprise first encoded values and second encoded values, and wherein:

the first encoded values comprise encoded instances of those of the sampled values in a lower range of a dynamic range of the audio signal, sampled to produce the sampled values, and encoded by a fixed mapping of the sampled values in the lower range of the dynamic range of the audio signal to a subset of quanta in a set of quanta having a depth less than a depth of the sampled values;

the second encoded values comprise encoded instances of those of the sampled values in an upper range of the dynamic range of the audio signal, and encoded by an adaptive mapping of the sampled values in the upper range of the dynamic range of the audio signal to a remaining subset of quanta in the set of quanta, the upper range ending at a maximum value among the sampled values of the audio signal; and the file further comprises a key for mapping the set of quanta to a set of corresponding decoded values having a depth greater than the depth of the set of quanta; and one or more processors operatively coupled with the memory and configured to read the file, map the first encoded values and the second encoded values to the decoded values using the key, and output the decoded values.

19. The computing apparatus of claim 18 wherein the computing apparatus further comprises an audio sub-system operatively coupled with the one or more processors and configured to generate an output audio signal based on the decoded values and drive an audible sound with the output audio signal.

20. The computing apparatus of claim 19 wherein the depth of the first encoded values comprises 8 bits, wherein the depth of the second encoded values comprises 8 bits, wherein the depth of the sampled values comprises 16 bits, wherein the depth of the decoded values comprises 16 bits, and wherein the depth of the set of quanta comprises 8 bits.

* * * * *